United States Patent [19]

Nakano et al.

[11] 4,232,815
[45] Nov. 11, 1980

[54] INTEGRATED CIRCUIT LEAD COUPLING DEVICE AND METHOD

[75] Inventors: Masahiko Nakano, San Diego; Nobuaki Miyauchi, both of San Diego, Calif.

[73] Assignee: Kyocera International, Inc., San Diego, Calif.

[21] Appl. No.: 958,118

[22] Filed: Nov. 6, 1978

[51] Int. Cl.³ .................... B23K 31/02; H01L 21/60
[52] U.S. Cl. .............................. 228/180 A; 29/827; 174/52 FP; 228/6 A; 357/70
[58] Field of Search .............. 228/180 A, 180 R, 212, 228/247, 49, 6 A; 29/628, 826, 827; 174/52 FP; 357/70; 361/421

[56] References Cited

U.S. PATENT DOCUMENTS

| | | | |
|---|---|---|---|
| 3,524,249 | 8/1970 | Toshio | 174/52 FP |
| 3,617,819 | 11/1971 | Boisvert | 174/52 FP |
| 3,823,863 | 7/1974 | Piechocki | 228/212 |
| 4,012,835 | 3/1977 | Wallick | 29/628 |
| 4,054,238 | 10/1977 | Lloyd | 29/628 |

Primary Examiner—Francis S. Husar
Assistant Examiner—Gene P. Crosby

[57] ABSTRACT

A device and method for coupling leads to integrated circuit packages via lead frame rail members. The lead frame rail members consist of resilient leads coupled to a first rail and other resilient leads coupled to a second rail. The first rail is connected to the second rail such that the leads of the first rail are separated from and oppose the leads of the second rail. The coupling device consists of a main frame, a spreading means, an insertion means, and a releasing means. The spreading means is coupled to the main frame and is adapted to spread the leads of each rail of a lead frame rail member away from the opposing leads of the other rail such that an integrated circuit package can be inserted between the opposing leads at intervals along the rail member. The insertion means is coupled to the main frame and is adapted to insert coupling material between the integrated circuit packages and the leads. The releasing means is also coupled to the main frame and is adapted to release the resilient leads of each rail member such that the coupling material is clamped between the leads and the package. Also included in the invention is a method for coupling leads to a plurality of integrated circuit packages.

29 Claims, 13 Drawing Figures

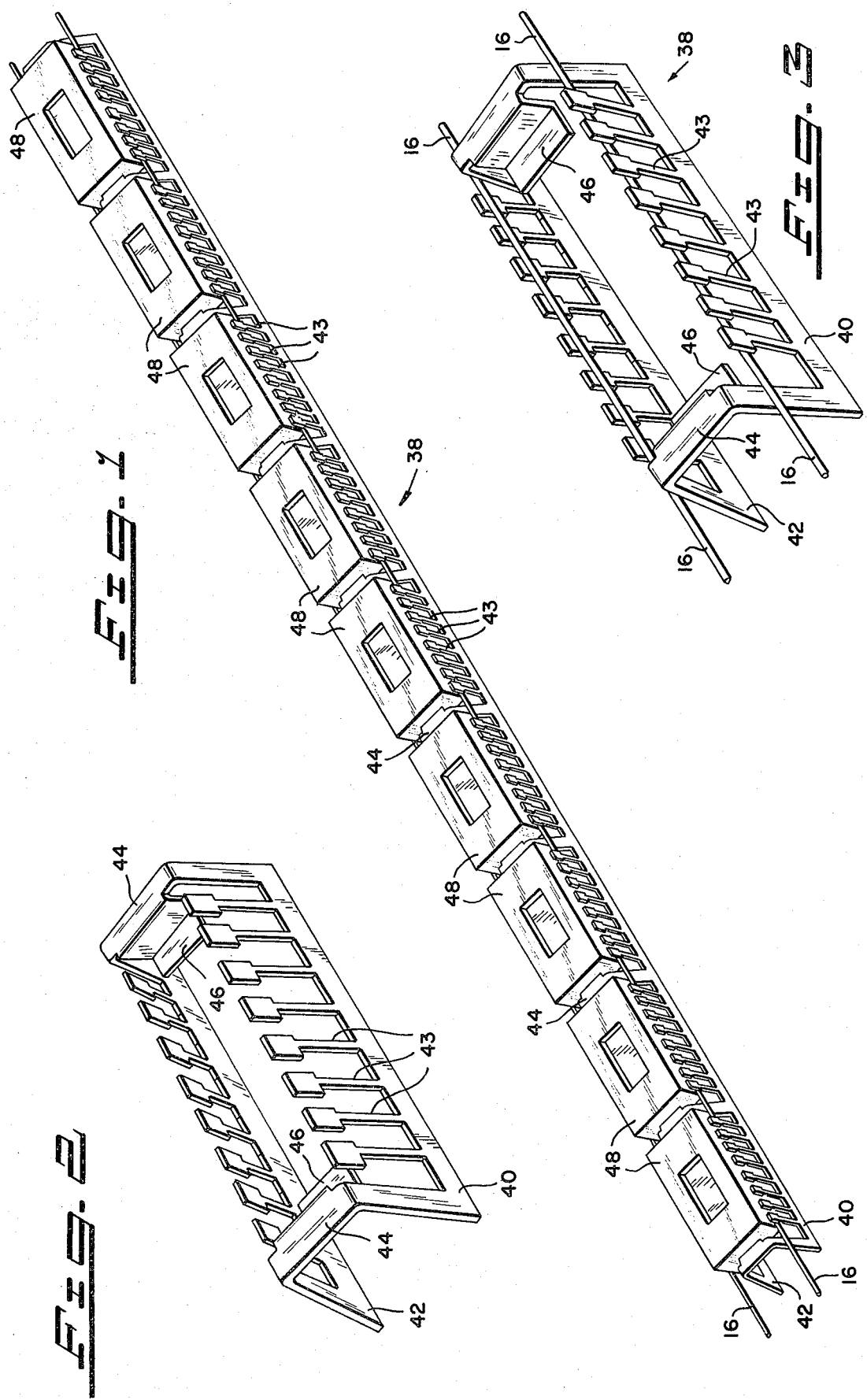

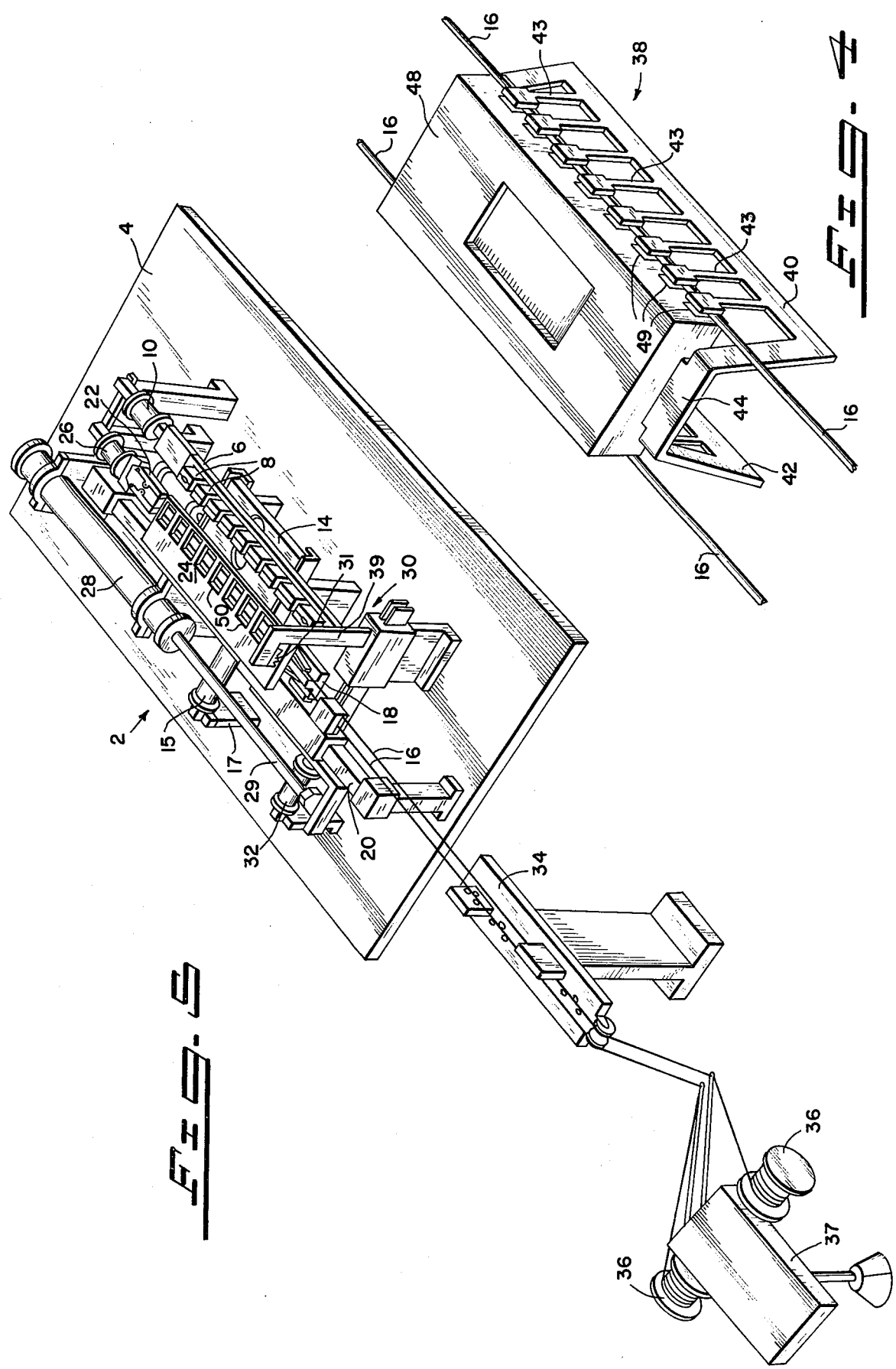

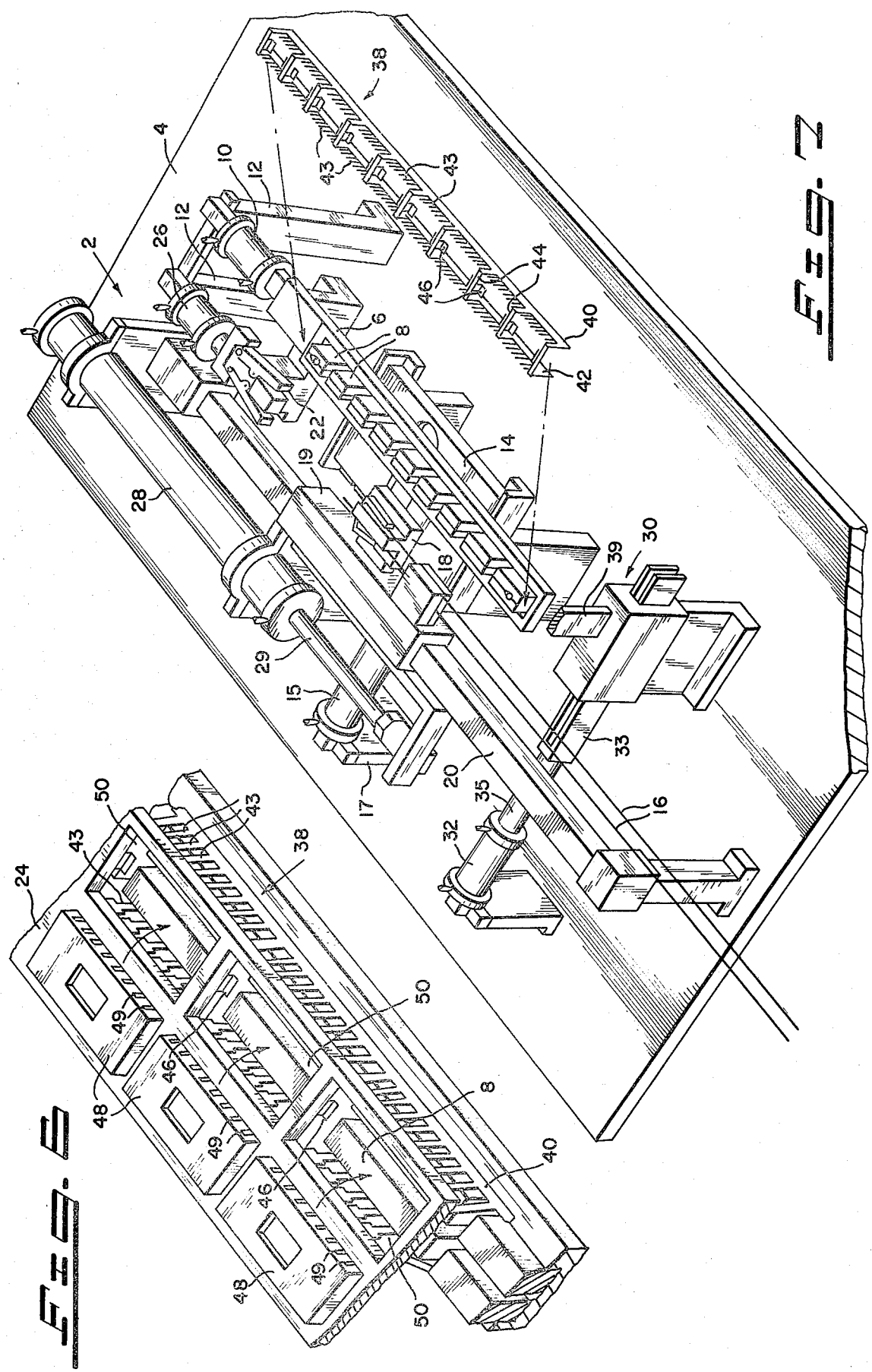

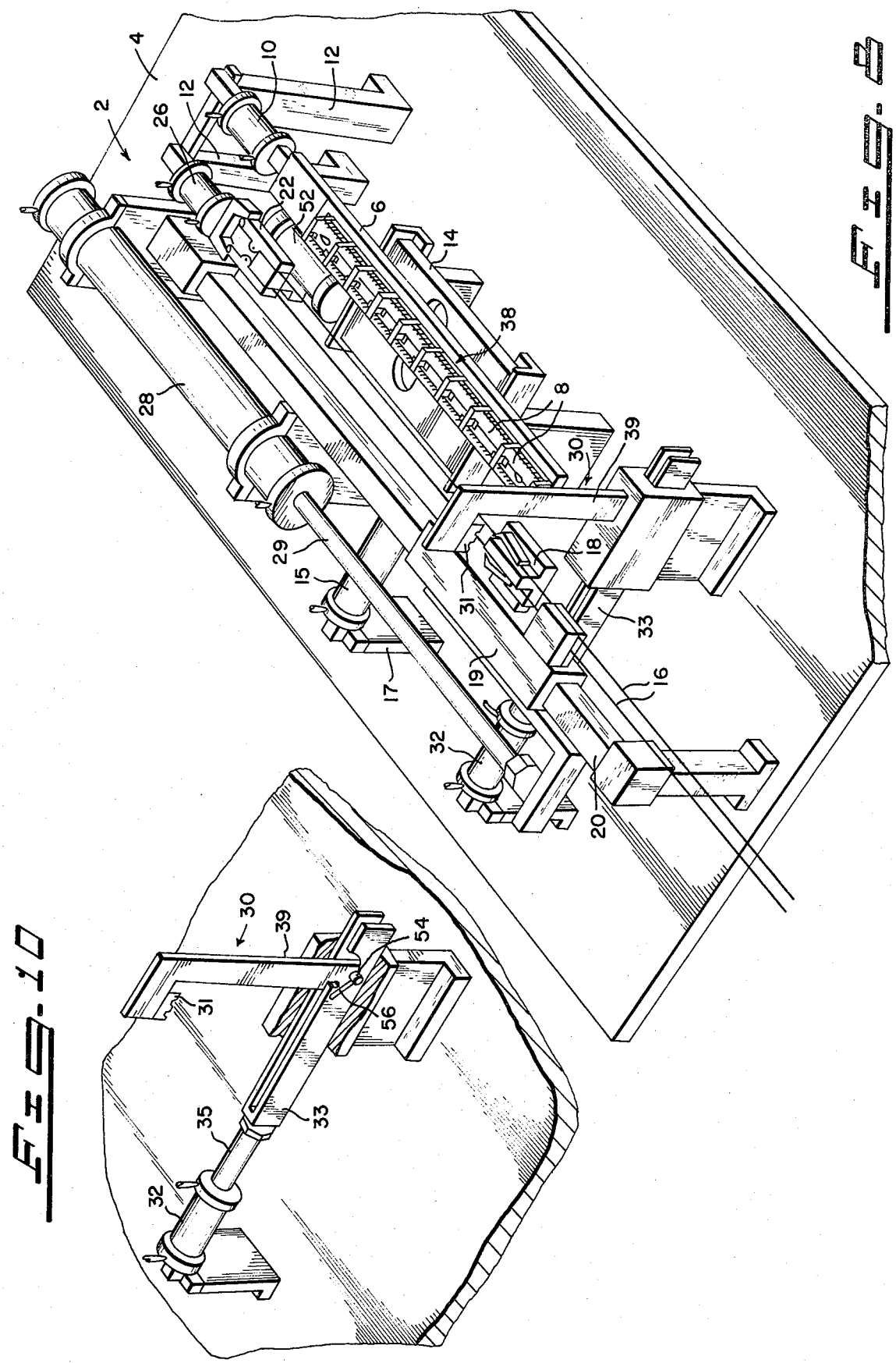

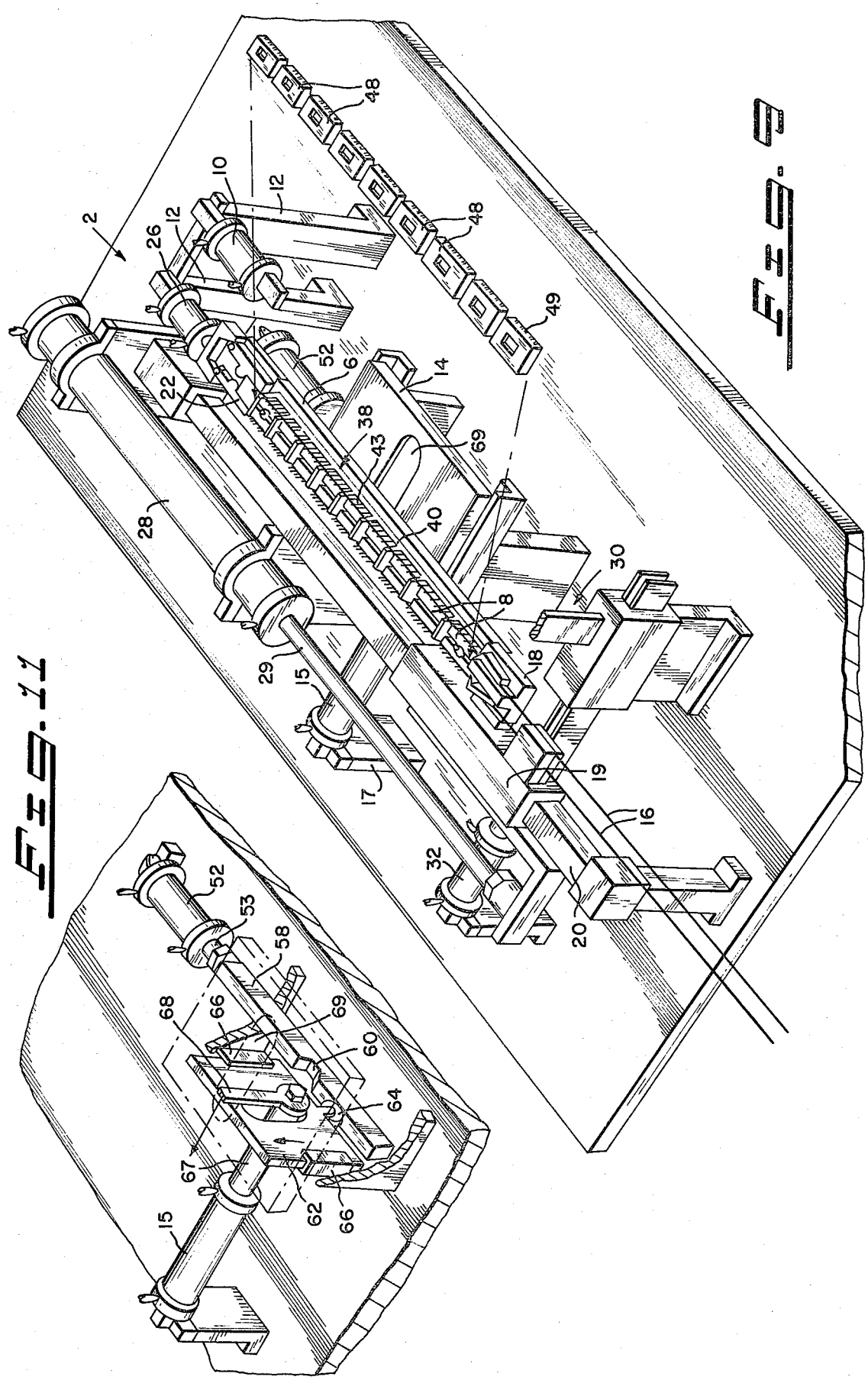

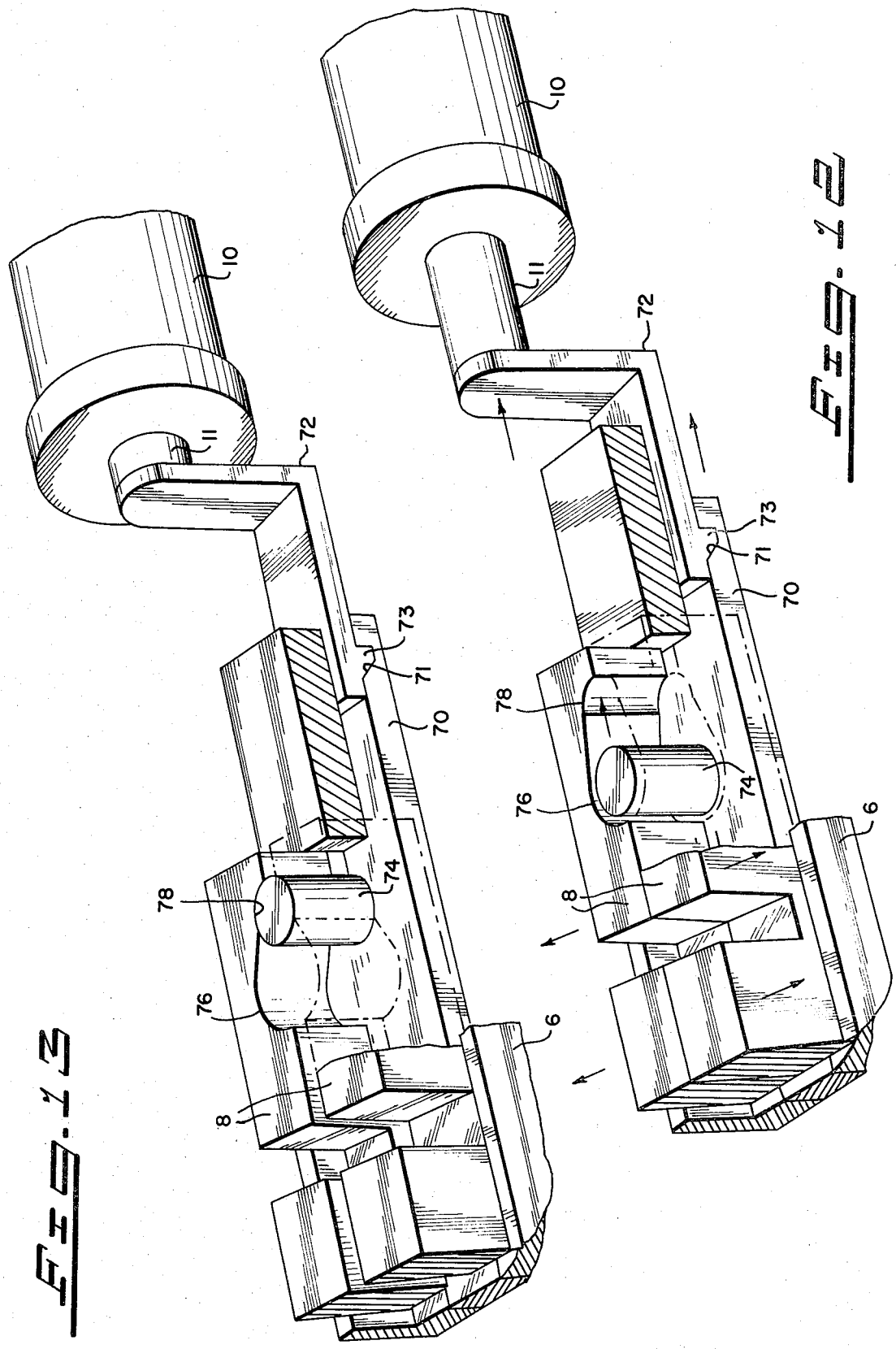

INTEGRATED CIRCUIT LEAD COUPLING DEVICE AND METHOD

BACKGROUND OF THE INVENTION

1. Field of the Invention

The present invention relates to the field of integrated circuit packages, and more specifically to a device and method for coupling leads to integrated circuits packages.

2. Prior Art

With the ever increasing popularity of ceramic integrated circuit packages, one problem has continued to plague the manufacturers of such packages. This problem has been a lack of a rapid and efficient method for coupling external electrical leads to the circuit package. In the prior art manufacturing processes, leads have been coupled to individual packages via single lead frames. That is, a lead frame, having a plurality of interconnected leads, is coupled to the exterior pads of one side of the integrated circuit package by soldering or brazing techniques. Then, a lead frame is coupled to the opposite side of the integrated circuit package. Later, the interconnecting members of the lead frames are cut from the lead frames, thus leaving leads extending from the integrated circuit package. It can be seen from this brief description that the prior art techniques for connecting leads to packages has been slow and cumbersome. In addition, these techniques have required the individual handling of the circuit packages as opposed to a mass-handling. Finally, these prior art techniques are not entirely effective in properly aligning and coupling leads to the package, often resulting in unusable packages due to misaligned leads.

Accordingly, it is a general object of the present invention to provide an improved device and method for coupling leads to integrated circuit packages.

It is another object of the present invention to provide an improved lead coupling device which can rapidly and efficiently connect leads to a plurality of integrated circuit packages.

It is yet another object of the present invention to provide a lead frame member which provides coupling of a plurality of integrated circuit packages for subsequent mass-handling and processing.

SUMMARY OF THE INVENTION

A device and method for rapidly and efficiently coupling leads to a plurality of integrated circuit packages is provided. The device and method utilize a lead frame rail member which consists of a first and second rail, each rail having a pluarlity of resilient leads coupled thereto. The rails are interconnected such that the leads of one rail are separated from and oppose the leads of the other rail. The coupling device consists of a main frame to which are coupled spreading means, insertion means, and releasing means. The spreading means is adapted to spread the leads of each rail of a lead frame rail member away from the leads of the other rail member. When these opposing leads are sufficiently spread, integrated circuit packages can be placed between the leads so that they are allowed to rest on seat members of the lead frame rail member. The insertion means then inserts a coupling material between the integrated circuit packages and the plurality of leads. Finally, the releasing means allows the leads of the lead frame rail member to return to their original position so as to resiliently engage the coupling material and the integrated circuit package and thus clamp the coupling material between the leads and the package. Later, heat can be applied to the individual leads so as to couple the leads to the integrated circuit package by means of the coupling material.

The novel features which are believed to be characteristic of the invention, both as to its organization and its method of operation, together with further objects and advantages thereof, will be better understood fom the following description in connection with the accompanying drawings in which a presently preferred embodiment of the invention is illustrated by way of example. It is to be expressly understood, however, that the drawings are for purposes of illustration and description only and are not intended as a definition of the limits of the invention.

BRIEF DESCRIPTION OF THE DRAWINGS

FIG. 1 is a perspective view of the lead frame rail member of the present invention;

FIG. 2 is an enlarged view of one portion of the lead frame rail member of the present invention;

FIG. 3 is an enlarged view of one portion of the lead frame rail member of the present invention;

FIG. 4 is an enlarged view of one portion of the lead frame rail member of the present invention;

FIG. 5 is a perspective view of the lead frame coupling device of the present invention;

FIG. 6 is an enlarged view of the guiding means of the lead frame coupling device of the present invention;

FIG. 7 is a perspective view of the lead frame coupling device of the present invention;

FIG. 8 is a perspective view of the lead frame coupling device of the present invention;

FIG. 9 is a persepective view of the lead frame coupling device of the present invention;

FIG. 10 is an enlarged perspective view of the shearing means of the present invention;

FIG. 11 is an enlarged view of the platform actuating means of the present invention;

FIG. 12 is an enlarged perspective view of the spreading means of the present invention; and FIG. 13 is an enlarged perspective view of the spreading means of the present invention.

DETAILED DESCRIPTION OF THE INVENTION

Referring to FIG. 1, there is illustrated in a perspective view the lead frame rail member 38 of the present invention. Rail member 38, which may be used in conjunction with the method and the coupling device of the present invention, both of which are described hereinbelow, is comprised of a first rail 40, a second rail 42, rail cross members 44, and leads 43. Lead frame rail member 38 is adapted to hold integrated circuit packages 48 in proper alignment with leads 43 and to secure a coupling material 16 between the leads 43 and the electrical pads of integrated circuit packages 48. Thus, lead frame rail member 38 allows a plurality of circuit packages 48 to be placed in proper alignment with leads 43 while securely holding these integrated circuit packages 48 for subsequent processing.

A unique method of coupling leads 43 to integrated circuit packages 48 will now be described with reference to FIGS. 2 through 4. Essentially, the method entails the spreading of leads 43 of each rail 40, 42 away from opposing leads 43 of the opposing rail 40, 42 so that integrated circuit packages 48 along with coupling material 16 may be placed therebetween. Then, leads 43 are released so that they resiliently engage coupling material 16 and packages 48 so as to clamp coupling material 16 between the upper portions of leads 43 and the electrical pads 49 of packages 48.

Now referring to FIG. 2, one portion of lead frame rail member 38 is shown prior to the insertion of integrated circuit packages 48 or coupling material 16. It may be noted from this illustration that resilient leads 43 of rail members 40 and 42 are resting in a steady state position which is approximately parallel to the generally vertical portions of rail coupling members 44.

The first step of the method of the present invention is shown in FIG. 3. It can be seen in FIG. 3 that resilient leads 43 have been spread outward from the center of lead frame rail member 38 such that they are no longer generally parallel with the substantially vertical portions of rail coupling member 44. In addition, coupling material 16 has been inserted along the interior surfaces of each set of leads 43 adjacent the upper portions of leads 43. Coupling material 16 may be a solder material, a brazing material or any other material which will allow for coupling of leads 43 to electrical pads 49. The spreading of leads 43 as well as the insertion of coupling material 16 can be performed manually, semi-automatically, or automatically, although a device for automatically performing this step is described hereinbelow.

Now referring to FIG. 4, the second and third steps of the inventive method are illustrated. It can be seen from this FIGURE that an integrated circuit package 48 has been placed between the outwardly spread leads 43 such that coupling material 16 lies between the upper portions of leads 43 and electrical coupling pads 49 of packages 48. Following insertion of integrated circuit package 48, leads 43 are released and, due to their resilient quality, clamp coupling material 16 between the upper portions of leads 43 and electrical pads 49 of package 48. Again, the steps of placing integrated circuit packages 48 within lead frame rail member 38, as well as the releasing of resilient leads 43 may be performed manually, semi-automatically, or automatically. The device described hereinbelow provides for the semi-automatic insertion of integrated circuit packages 48 along with the automatic release of leads 43.

After completion of the above described steps of the inventive method, packages 48 remain securely positioned within lead frame 38 for further processing, including the permanent coupling of leads 43 to pads 49 by the application of heat. Also, in subsequent processing steps, rails 40 and 42 along with coupling member 44 may be severed from leads 43, thus leaving only leads 43 extending from package 48. This clamping of packages 48 within lead frames 38 greatly facilitates handling and subsequent processing because a plurality of packages 48 may be handled and processed simultaneously.

In alternate steps of the present method, the coupling material may be preclad (i.e., applied previously) on the inner surfaces of the upper portions of leads 43 so that the step of inserting coupling material 16 between leads 43 and integrated circuit packages 48 may be eliminated. This coupling material can be solder, brazing material, or other materials which allow the coupling of leads 43 to electrical coupling pads 49.

Referring to FIG. 5 lead frame coupling device 2, the presently preferred device for semi-automatically performing the steps of the method of the present invention, is schematically illustrated. Lead frame coupling device 2 has a main frame 4 to which is coupled lead frame rail support 6. As will be described more fully hereinbelow, lead frame rail members 38 are placed on lead frame rail support 6 and manipulated by coupling device 2 to allow the coupling of leads to a plurality of integrated circuit packages 48.

The essential operation of coupling device 2 is as follows: spreading and releasing means 8, which is disposed directly above lead frame rail support 6, expands laterally, by the action of spreading means hydraulic cylinder 10, so as to spread leads 43 of lead frame rail member 38. Lead frame rail support 6 is then moved laterally inward along rail platform 14, by hydraulic cylinder 15 such tht rail support 6 is located under steering means 24. Prior to the lateral movement of rail support 6, wirelike coupling material 16 has been stretched between clamp 22 and wire guide 18 by the movement of wire guide 18 along wire guide support 20. Wire coupling material 16 is continuously provided by spools 36 on support 37 and is directed by wire direction control 34.

Once lead frame rail support 6 and lead frame rail member 38 coupled thereto are disposed under steering means 24, lead frame rail platform 14 is raised vertically such that coupling material 16 is placed adjacent leads 43 and on the interior surface thereof. Integrated circuit packages 48 are then placed in apertures 50 of steering means 24 so as to be guided into the appropriate locations between leads 43 of rail member 38. Upon the actuation of release hydraulic cylinder 26, spreading and releasing means 8 is moved laterally together such that leads 43 are allowed to resiliently engage coupling material 16 and thereby clamp integrated circuit packages 48 between the opposing leads 43.

Finally, lead frame rail support 6, lead frame rail member 38, including coupling material 16 and a plurality of integrated circuit packages 48, is lowered by lead frame rail platform 14 and moved laterally out from under steering means 24. Lead frame rail member 38 may then be removed from lead frame rail support 6 for subsequent processing, including the coupling of leads 43 to packages 48 via coupling material 16 and the application of heat.

Also shown in FIG. 5 is wire shears 30 with its cutting surface 31 and associated hydraulic cylinder 32. As will be described more fully hereinbelow, cutting surface 31 of shears 30 is drawn downward by cylinder 32 so as to cut coupling material 16 at the appropriate length. Also, wire guide hydraulic cylinder 28 with its piston 29 is shown coupled to wire guide 18 and is adapted to move wire guide 18 along the length of wire guide support 20 so as to move coupling material 16 to clamp 22.

FIG. 7 is a perspective view of lead frame coupling device 2 with steering means 24 removed so as to more fully disclose the various components of device 2, as well as the movement of wire guide 18. It can be seen in FIG. 7, as compared with FIG. 5, that wire guide 18 has clamped onto coupling material 16 and is being moved along wire guide support 20 by wire guide slide 19. This movement of wire guide slide 19 is brought about by the movement of piston 29 into wire guide hydraulic cylinder 28. It can also be seen in FIG. 7 that clamp 22 has been opened by release hydraulic cylinder 26 so that clamp 22 is ready for the insertion of coupling material 16 therein, when wire guide 18 has moved the length of support 20. Also illustrated in FIG. 7 is the actuation means for wire shears 30, including shear arm 33 which is coupled to shear hydraulic cylinder 32 via piston 35.

FIG. 8 is another perspective view of lead frame coupling device 2 with steering means 24 removed to show further components of coupling device 2 as well as positioning of coupling material 16. In a comparison of FIG. 8 to FIG. 7, it can be seen that wire guide 18 has returned to its original position following the insertion of coupling material 16 into clamp 22. Clamp 22 has been actuated by release hydraulic cylinder 26 so as to grasp and secure coupling material 16. Wire guide 18 has moved to its original position by the movement of wire guide slide 19 on wire guide support 20 as a result of the extension of piston 29 from wire guide hydraulic cylinder 28. It can also be seen in FIG. 8 that lead frame rail member 38 has been inserted on lead frame rail support 6, although spreading and releasing means 8 has not yet been actuated by hydraulic cylinder 10.

Now referring to FIG. 9, it can be seen that lead frame rail support 6 and lead frame rail member 38 have moved laterally across lead frame rail platform 14 by the actuation of hydraulic cylinder 15. This lateral movement has placed lead frame rail member 38 directly under coupling material 16. In addition, it can be seen that lead frame rail platform 14 has moved upward by the actuation of hydraulic cylinder 52. This upward movement of platform 14, and correspondingly, the upward movement of lead frame rail member 38 has resulted in the insertion of coupling material 16 adjacent the interior surfaces of leads 43 of lead frame rail member 38. It can further be seen in FIG. 9 that spreading and releasing means 8 has moved laterally apart so as to spread leads 43 of one rail 40, 42 from leads 43 of the other rail 40, 42. As described hereinabove, by means of steering means 24, integrated circuit packages 48 are placed into the appropriate slots of lead frame rail member 38 so as to be located between opposing leads 43 and opposing coupling materials 16.

Following the insertion of integrated circuit packages 48 into lead frame rail member 38, lead frame rail support 6 is lowered on lead frame rail platform 14 by means of hydraulic cylinder 52, and then moved laterally outward on platform 14 by means of hydraulic cylinder 15. Lead frame rail member 38, containing integrated circuit packages 48 and coupling material 16 disposed between leads 43 and the electrical pads of packages 48, can then be removed from lead frame coupling device 2 for subsequent processing. Such processing can include the application of heat to leads 43 so as to melt coupling material 16 between the pads of packages 48 and leads 43, and thereby couple leads 43 to packages 48.

Again referring to FIG. 4 the relationship between leads 43, coupling material 16, and integrated circuit package 48 can be seen in greater detail. Once integrated circuit package 48 has been placed between the expanded leads 43, and coupling material 16 has been placed between leads 43 and pads 49 of package 48, leads 43 resiliently engage coupling material 16 which in turn abuts pads 49 of package 48. Thus, FIG. 4 illustrates that lead frame rail member 38, used in conjunction with coupling device 2, results in the correct and sure alignment of leads 43 in their relationship to pads 49 as well as the proper positioning of coupling material 16.

FIG. 6 shows in greater detail the interaction of steering means 24 and lead frame rail member 38 when rail member 38 is positioned under steering means 24. Here, it can be seen that integrated circuit packages 48, with their associated pads 49, can be moved laterally along the surface of steering means 24 until they fall into the apertures 50 of steering means 24. Apertures 50 are so positioned above lead frame rail member 38 that each integrated circuit package 48 is caused to fall into the appropriate slot of lead frame rail member 38 and ultimately rest on seats 46 of rail member 38. It can also be seen in FIG. 6 that spreading and releasing means 8 is in its expanded configuration. That is, having moved laterally apart, spreading means 8 has caused the spreading of leads 43 away from opposing leads 43 so that there is sufficient space for packages 48 to fit between leads 43.

FIG. 10 shows in greater detail the operative members of wire shears 30. Wire shears hydraulic cylinder 32 is coupled to shear arm 33 by hydraulic piston 35. Disposed in shear arm 33 is slot 56, while pin 54 is disposed in slot 56 and coupled to shear vertical member 39. It can be seen in FIG. 10 that when hydraulic cylinder 38 is actuated such that piston 35 is pushed either inward or outward, shear arm 33 is caused to move in relationship to pin 54 of shear vertical member 39. This lateral movement of shear arm 33 causes pin 54 to ride in the confines of slot 56, resulting in horizontal movement of shear vertical member 39. FIG. 10 illustrates the most downward position of shear vertical member 39, and correspondingly, shear cutting surface 31, due to the retraction of piston 35. When piston 35 is extended outward by cylinder 32, pin 54 will ride toward the upper portions of slot 56 resulting in the upward movement of shear vertical member 39 and cutting surface 31. Thus, it can be seen from FIG. 10 that when coupling material 16 is to be cut, cylinder 32 is actuated such that piston 35 is retracted, resulting in the downward movement of cutting surface 31. This downward movement continues until cutting surface 31 has cut through coupling material 16. When this cutting action is completed, extension of piston 35 by cylinder 32 results again in the upward movement of cutting surface 31.

FIG. 11 shows in greater detail the components which result in the lateral and vertical movement of lead frame rail support 6. As described hereinabove, lead frame rail support 6 is first laterally moved under coupling material 16 and steering means 24. Next, lead frame rail support 6 is moved vertically upward so as to insert coupling material 16 adjacent the interior surfaces of leads 43. When integrated circuits 48 are inserted within lead frame rail member 38, lead frame rail support 6 is lowered below steering means 24 and laterally moved outward along lead frame rail platform 14 to its original position.

The lateral movement of lead frame rail member 38 is caused by hydraulic cylinder 15 which is coupled to rail support 6 by piston 67 and rail support actuator 68. Rail support actuator 68 is selectively coupled to the bottom of lead frame rail support 6. It can be seen in FIGS. 9 and 11 that aperture 69 in rail platform 14 allows, without interference, the lateral movement of rail support actuator 68 through platform 14. Thus, when lead frame rail member 38 is to be moved laterally under coupling material 16 and steering means 24, hydraulic cylinder 15 is actuated such that piston 67 is drawn into cylinder 15. This inward movement of piston 67 causes rail support actuator 68 to move laterally through aperture 69 of platform 14. Because actuator 68 is selectively coupled to a lower portion of lead frame rail support 6, the resulting inward movement of actuator 68 causes lead frame rail support 6, in thus lead frame rail member 38 to move under coupling material 16. Correspondingly, actuation of cylinder 15, which results in the extension of piston 67, causes lead frame rail support 6 to move laterally out from under coupling material 16.

Vertical movement of lead frame rail support 6 is a result of the vertical movement of lead frame rail platform 14. Extending below lead frame rail platform 14 is platform base 62 which is slideably disposed in platform base guide 66. Disposed on the bottom portion of platform base 62 is platform base roller bearing 64 which is adapted to ride along the upper surface of slide bar 58. Slide bar 58 is coupled to platform raising hydraulic cylinder 52 by piston 53.

It can be seen in FIG. 11 that when hydraulic cylinder 52 causes the retraction of piston 53, slide bar 58 moves toward cylinder 52 causing platform base roller bearing 64 to move out of detent 60 of slide bar 58. This movement of bearing 64 out of detent 60 and onto the upper surface of bar 58 results in the upward movement of platform base 62 and correspondingly, the upward movement of lead frame rail platform 14.

In a similar manner, when rail platform 14 is to be lowered, hydraulic cylinder 52 is actuated such that piston 53 moves slide bar 58 in relation to roller bearing 64 so that bearing 64 returns to the detent 60 of slide bar 58. This movement of roller bearing 64 from the upper surface of slide bar 58 to the lower surface of detent 60 results in the downward movement of platform base 62 through platform base guide 66, resulting in the downward movement of lead frame rail platform 14. It is important to note that rail support actuator 68 is not permanently coupled to lead frame rail member 38 but instead, actuator 68 is disposed in a slot in the bottom portion of rail member 38. Thus, when rail member 38 is raised vertically by lead frame rail platform 14, rail member 38 is disengaged from actuator 68 as actuator 68 is removed from the slot in the bottom of rail member 38. Then, when lead frame rail member 38 is lowered by platform 14, it again engages rail support actuator 68 when actuator 68 protrudes into the slot in the bottom of rail member 38. Rail support actuator 68 is then available for lateral movement of rail member 38.

FIGS. 12 and 13 show in greater detail the mechanisms used for spreading and releasing means 8. Hydraulic cylinder 10 is coupled to spreader actuator 72 by piston 11. Spreader actuator 72 has a key portion 73 disposed along its lower surface. Key 73 of spreader actuator 72 is adapted to be disposed in the correspondingly-shaped detent 71 of spreader slide bar 70. Spreader slide bar 70 is slidebly disposed beneath spreading and releasing means 8, but is fixedly coupled to spreader pin 74.

In FIG. 12, piston 11 is in its expanded position due to the expulsion of piston 11 by cylinder 10. This outward movement of piston 11, and the resulting outward movement of spreader actuator 72 and spreader slide bar 70 has located spreader pin 74 in the broadest portion of aperture 76. Because the circumference of aperture 76 is larger than pin 74, pin 74 does not contact surfaces of spreading and releasing means 8 and thus exerts no outward pressure on the surfaces. However, as shown in FIG. 13, when piston 11 is retracted by cylinder 10, spreader pin 74 is retracted by slide bar 70. This retraction of spreader pin 74 causes a contact between pin 74 and the side surfaces of spreading and releasing means 8. This contact results in the outward lateral expansion of spreading and releasing means 8 until pin 74 is disposed in circular detent 78 of aperture 76.

It should be noted that once pin 74 is disposed in circular detent 78, spreading and releasing means 8 will be locked in its expanded position without the requirement of further retraction force being applied to slide bar 70 by spreader actuator 72. Thus, spreading and releasing means 8 will stay in its expanded position when lead frame rail support 6 is laterally moved across platform 14, even though slide bar 70 is thereby disengaged from spreader actuator 72. Spreading and releasing means 8 will stay in this expanded configuration until hydraulic cylinder 26 and its associated spreader actuator is actuated, causing pin 74 to move out of circular detent 78 into the wider portions of aperture 76. This outward movement of pin 74 results in the return of spreading and releasing means 8 to its original position, thereby releasing leads 43 of lead frame rail member 38.

Based on the foregoing description of the various components of coupling device 2, a more detailed description of the operation of device 2 can now be given. In reference to FIG. 7, prior to a lead frame rail member 38 being placed on lead frame rail support 6, the following actions have occurred. Wire guide 18, along with wire guide slide 19 have moved along wire guide support 20 and have pulled wirelike coupling material 16 toward clamp 22. When wire guide 18 progressed toward clamp 22 such that the coupling material 16 which extends from wire guide 18 was within clamp 22, cylinder 26 was actuated so that clamp 22 closed on coupling material 16 so as to hold it securely therein. Then, wire guide 18 and wire guide slide 19 returned along wire guide support 20 to their original position while coupling material 16 slid through wire guide 18. When wire guide 18 and wire guide slide 19 returned to their original position on wire guide support 20, the two strands of coupling material 16 remain stretched between clamp 22 and wire guide 18. Next, hydraulic cylinder 32 was actuated so as to cause wire shears 30 to sever coupling material 16 at a point adjacent wire guide means 18. Thus, the two strands of coupling material 16, which now have been cut to a length approximately that of lead frame rail member 38, are now ready to be inserted within lead frame rail member 38.

Following these preparatory steps, device 2 is ready for an operator to place an empty lead frame rail member 38 on lead frame rail support 6. Then, hydraulic cylinder 10 is actuated such that spreading and releasing means 8 is expanded to its locked position. The expansion of spreading and releasing means 8 results in the expansion of leads 43 of each rail 40, 42, from the opposing leads 43 of the opposing rail 40, 42. Next, lead frame rail support 6, along with lead frame rail member 38, is moved laterally toward coupling material 16. It can be seen from FIG. 12 that such lateral movement of lead frame rail support 6 causes spreader slide bar 70 to slide along key 73 of spreader actuator 72 to the extent that lead frame rail support 6 becomes completely disengaged from actuator 72.

When lead frame rail support 6 is appropriately located under coupling material 16, lead frame rail platform 14 is raised by hydraulic cylinder 52. This vertical movement of platform 14 causes lead frame rail support 6 to become disengaged from rail support actuator 68 and ultimately positions coupling material 16 adjacent leads 43 of each rail, 40, 42 of lead frame rail member 38. At the termination of this vertical movement of rail member 38, detent 71 of spreader slide bar 70 engages a key which extends under clamp 22. This key is coupled to hydraulic cylinder 26 in a manner substantially similar to the coupling of key 73 to actuator 72.

Next, integrated circuit packages 48 are pushed into apertures 50 of steering means 24 so as to place integrated circuit packages 48 within the appropriate slots of lead frame rail member 38. Integrated circuit packages 48 rest upon seats 46 of rail member 38 and are so positioned that pads 49 of packages 48 are adjacent coupling material 16 and leads 43. Hydraulic cylinder 26 is then actuated to bring about the release of leads 43 and the release of wire coupling material 16 by clamp 22. The release of leads 43 is accomplished by the outward movement of the piston of cylinder 26 causing the key to move the slide bar 70 outward, thereby moving spreader pin 74 from circular detent 78 into the wider portion of aperture 76. At this point leads 43 resiliently grip coupling material 16 against the pads 49 of integrated circuit packages 48.

Next, platform 14 is lowered by the actuation of hydraulic cylinder 52 to its original position. Then, by actuation of hydraulic cylinder 15, lead frame rail support 6 and lead frame rail member 38 containing the integrated circuit packages 48 and the lengths of coupling material 16 are moved laterally out from under steering means 24 to the position as depicted in FIG. 7. Finally, lead frame rail member 38 along with the integrated circuit packages 48 and coupling material 16 can be removed from lead frame rail support 6 for further processing, including the permanent coupling of leads 43 to pads 49 of integrated circuit packages 48 by the application of heat. The removal of lead frame rail member 38 allows for the immediate insertion of another rail member 38 so that the process defined hereinabove may be repeated.

Coupling device 2 may also be used in conjunction with lead frame rail members 38 which have had coupling material preclad on the inner surfaces of the upper portions of leads 43. When such preclad rail members are used, coupling material 16 is not provided to coupling device 2 so that the steps of stretching and cutting material 16 between clamp 22 and wire guide 18 are not performed. Other than the non-performance of these steps, the operation and function of coupling device 2, when preclad rail members 38 are used, is as described hereinabove. Of course, if coupling device 2 is to be used primarily or exclusively with preclad rail members 38, then those components of device 2 associated with material 16 guiding, stretching and cutting may be eliminated.

There has been described herein a new and novel lead frame coupling device and method. While specific embodiments of the present inventions have been disclosed and described in detail herein, it will be understood by those skilled in the art, that various changes in form and detail may be made therein without departing from the spirit and scope of the invention.

We claim:

1. A method for coupling leads to integrated circuit packages comprising the steps of:
   (i) providing a lead frame rail member comprising a plurality of resilient leads coupled to a first rail and a plurality of resilient leads coupled to a second rail, said first rail coupled to said second rail such that leads of said first rail are separated from and oppose said leads of said second rail;
   (ii) spreading the leads of each said rail away from the opposing leads of the other rail;
   (iii) placing an integrated circuit package between said opposing leads at intervals along the length of said lead frame rail member;
   (iv) releasing said leads whereby a plurality of said leads resiliently engage each said integrated circuit package; and
   (v) affixed said leads to said integrated circuit packages.

2. The method of claim 1 wherein the inner portions of said resilient leads are precoated with a material to provide fixation of said leads to said integrated circuit packages.

3. The method of claim 2 wherein said material is solder and said leads are affixed to said package by means of heat.

4. The method of claim 2 wherein said material provides a brazing of said leads to said integrated circuit package following the application of heat to said leads and package.

5. A method for coupling leads to integrated circuit packages comprising the steps of:
   (i) providing a lead frame rail member comprising a plurality of resilient leads coupled to a first rail and a plurality of resilient leads coupled to a second rail, said first rail coupled to said second rail such that leads of said first rail are separated from and oppose said leads of said second rail;
   (ii) spreading the leads of each said rail away from the opposing leads of the other rail;
   (iii) placing coupling material within the area between said opposing leads and adjacent said leads;
   (iv) placing an integrated circuit package between said opposing leads at intervals along the length of said lead frame rail member;
   (v) releasing said leads whereby a plurality of said leads resiliently engage said coupling material and thereby clamp said coupling material between said leads and said package; and
   (vi) affixing said leads to said integrated circuit package by means of said coupling material.

6. The method of claim 5 wherein said coupling material is solder and said leads are affixed to said package by heat.

7. The method of claim 5 wherein said coupling material provides a brazing of said leads to said integrated package following the application of heat to said leads and said package.

8. The method of claim 5 wherein said coupling material is in the form of a wire.

9. A device for coupling leads to integrated circuit packages utilizing lead frame rail members, said rail members having a plurality of resilient leads attached to a first rail and a plurality of resilient leads attached to a second rail, said first rail attached to said second rail such that leads of said first rail are separated from and oppose said leads of said second rail, said device comprising:
   (i) a main frame;
   (ii) spreading means coupled to said main frame and selectively engaging said leads for spreading said leads of each said rail away from the opposing leads of the other rail such that an integrated circuit package can be inserted between said opposing leads at intervals along the length of said lead frame rail member;

(iii) insertion means coupled to said main frame for inserting coupling material between said integrated circuit packages and said leads; and (iv) releasing means coupled to said main frame for releasing said leads of each said rail member such that said leads resiliently engage said coupling material and thereby clamp said coupling material between said leads and said package.

10. The device of claim 9 wherein said spreading means and said releasing means comprise an elongated member disposed between said opposing leads and adapted to expand and contract laterally.

11. The device of claim 10 wherein said elongated member comprises two elongated portions adapted to move laterally apart so as to separate further said opposing leads and adapted to move laterally together so as to release said opposing leads.

12. The device of claim 11 wherein said elongated portions are moved laterally by hydraulic means.

13. The device of claim 9 wherein said coupling material is a wirelike material and said insertion means comprises a wire guiding means for guiding at least one said wirelike material into a position such that said material can be inserted between said integrated circuit packages and said leads.

14. The device of claim 13 wherein said wire guiding means comprises:
(i) an elongated support member;
(ii) a clamp member adapted to selectively secure at least one said wirelike material; and
(iii) a guide member slideably disposed on said support member and adapted to selectively grasp and guide at least one said wirelike material to said clamp member whereby said wirelike material is tensioned between said clamp member and said guide member so as to be available for insertion between said integrated circuit packages and said leads.

15. The device of claim 14 wherein said insertion means further comprises positioning means for positioning said lead frame rail member in such a manner that said wirelike material is adjacent the interior surface of said leads.

16. The device of claim 15 wherein said positioning means is adapted to move sequentially said lead frame rail member laterally under said wirelike material and then vertically such that said wirelike material is inserted adjacent the interior surface of said leads.

17. The device of claim 9 further comprising steering means for guiding said integrated circuit packages into said lead frame rail member, said steering means coupled to said main frame.

18. The device of claim 17 wherein said steering means comprises an elongated member having a plurality of apertures, said apertures being slightly larger than said integrated circuit packages and disposed above said lead frame rail member whereby packages placed in said apertures are guided into said lead frame rail member and between opposing leads thereof.

19. A device for coupling leads to integrated circuit packages utilizing lead frame rail members, said rail members having a plurality of resilient leads attached to a first rail and a plurality of resilient leads attached to a second rail, said first rail attached to said second rail such that leads of said first rail are separated from and oppose said leads of said second rail, said device comprising:
(i) a main frame;
(ii) spreading means coupled to said main frame and selectively engaging said leads for spreading said leads of each said rail away from the opposing leads of the other rail such that an integrated circuit package can be inserted between said opposing leads at intervals along the length of said lead frame rail member; and
(iii) releasing means coupled to said main frame for releasing said leads of each said rail member such that said leads resiliently engage each said integrated circuit package.

20. The device of claim 19 wherein said spreading means and said releasing means comprise an elongated member adapted to be disposed between said opposing leads and to expand and contract laterally.

21. The device of claim 20 wherein said elongated member comprises two elongated portions adapted to move laterally apart so as to separate further said opposing leads and adapted to move laterally together so as to release said opposing leads.

22. The device of claim 21 wherein said elongated portions are moved laterally by hydraulic means.

23. The device of claim 19 wherein the inner portions of said resilient leads of said rail members are precoated with a material to provide fixation of said leads to said integrated circuit packages.

24. The device of claim 19 further comprising steering means for guiding said integrated circuit packages into said lead frame rail member, said steering means coupled to said main frame.

25. The device of claim 24 wherein said steering means comprises an elongated member having a plurality of apertures, said apertures being slightly larger than said integrated circuit packages and disposed above said lead frame rail member whereby packages placed in said apertures are guided into said lead frame rail member and between opposing leads thereof.

26. A lead frame rail member for use in coupling leads to a plurality of integrated circuit packages comprising:
(i) a first rail;
(ii) a second rail coupled to said first rail, said first and second rails at least as long as two said integrated circuit packages; and
(iii) a plurality of resilient leads coupled to said first and second rails such that leads of said first rail are separated from and oppose said leads of said second rail, whereby at least two integrated circuit packages can be placed along the length of said first and second rails between said resilient leads said resilient leads bearing upon said packages by the resiliency of said leads.

27. The lead frame rail member of claim 26 wherein said first rail is coupled to said second rail by a plurality of cross members, said cross members spaced along said rail member at intervals substantially equal to the length of said integrated circuit packages.

28. The lead frame rail member of claim 26 further comprising seat members coupled to and disposed between said rails so as to support and position said integrated circuit packages between said opposing leads.

29. The lead frame rail member of claim 28 wherein said seat members couple said first rail to said second rail such that leads of said first rail are separated from and oppose said leads of said second rail.

* * * * *